(12) United States Patent
Mah

(10) Patent No.: US 9,407,225 B2
(45) Date of Patent: Aug. 2, 2016

(54) SOUND AMPLIFIER SYSTEM AND METHOD FOR AMPLIFYING ENGINE SOUNDS

(71) Applicant: MANN+HUMMEL GMBH, Ludwigsburg (DE)

(72) Inventor: Keat Boon Mah, Portage, MI (US)

(73) Assignee: MANN+HUMMEL GMBH, Ludwigsburg (DE)

( * ) Notice: Subject to any disclaimer, the term of this patent is extended or adjusted under 35 U.S.C. 154(b) by 98 days.

(21) Appl. No.: 14/521,220

(22) Filed: Oct. 22, 2014

(65) Prior Publication Data

US 2016/0118950 A1    Apr. 28, 2016

(51) Int. Cl.
*H04B 1/00* (2006.01)
*H03G 3/20* (2006.01)
*B60Q 5/00* (2006.01)

(52) U.S. Cl.
CPC . *H03G 3/20* (2013.01); *B60Q 5/005* (2013.01)

(58) Field of Classification Search
USPC ............. 381/61, 86, 389; 181/202–205, 211, 181/212, 224, 228, 248, 269; 340/463, 466, 340/467; 123/184.57, 184.53; 701/36; 180/69.22, 169, 690
See application file for complete search history.

(56) References Cited

U.S. PATENT DOCUMENTS

| | | | | |
|---|---|---|---|---|
| 2010/0329476 | A1* | 12/2010 | Khami | F02M 35/1294 381/86 |
| 2015/0176550 | A1* | 6/2015 | Mikolajewski | B60Q 5/00 123/184.57 |

* cited by examiner

*Primary Examiner* — Vivian Chin
*Assistant Examiner* — Friedrich W Fahnert
(74) *Attorney, Agent, or Firm* — James Hasselbeck

(57) ABSTRACT

A sound enhancing system is disclosed for use with an engine of a vehicle to amplify engine sounds produced by the engine over a predetermined engine RPM operating range. The sound enhancing system includes a sound enhancing component which may be fixedly mounted within an engine compartment so that it does not move relative to the engine as the engine experiences engine roll during changes in engine RPM or a load experienced by the engine. An inlet duct communicates with an inlet of the sound enhancing component and receives air pulsations drawn in by the vehicle's induction system, and is able to vary in length as the engine roll occurs, when engine RPM increases and decreases. This enables a frequency response of the sound enhancing component to be modified in accordance with changing engine RPM or the load experienced by the engine.

20 Claims, 4 Drawing Sheets

SOUND AMPLIFIER SYSTEM AND METHOD FOR AMPLIFYING ENGINE SOUNDS

FIELD

The present disclosure relates to devices and systems for amplifying engine sounds, wherein the engine sounds change in volume and frequency in accordance with the engine RPM of a motor vehicle engine, and more particularly to a noise amplification system and method which is able to respond to a broader frequency range of engine sounds associated with varying engine loads and varying engine RPM.

BACKGROUND

The statements in this section merely provide background information related to the present disclosure and may not constitute prior art.

Sound amplifying devices for amplifying the sounds emitted from a motor vehicle engine are sometimes referred to as "symposers". Symposers are used in motor vehicle applications to enhance and/or modify the sound produced by a vehicle engine as the engine is operating. With present day vehicle manufacturers placing a heavy emphasis on sound proofing the cabins of their vehicles, this has resulted in significantly attenuating the engine sound within the vehicle's cabin. However, in certain instances, and sometimes with certain vehicles such as sports cars, sedans, sport SUVs or sport trucks, it is desirable to provide a clearly audible engine sound within the cabin when the vehicle is accelerating or otherwise operating under a heavy load. With sports cars and other performance/racing inspired vehicles, this is especially so, as the driver typically appreciates and enjoys the engine sound emitted within the cabin under hard acceleration.

Conversely, the need for audible engine sounds within the cabin is not necessarily as desirable while the vehicle is cruising with its engine operating at a relatively low RPM. So for example, while cruising down a highway in fifth or sixth gear, with the engine operating at, for example 2000 RPM or lower, there is a desire to attenuate the engine sound heard within the cabin by the vehicle operator. This enhances the operator's ability to listen to dialogue or music provided by the vehicle's audio system and reduces the need to raise the volume to overcome the sound of the engine.

Previously developed symposers have typically relied on the use of internally mounted valves that modify and/or restrict a flow path for intake airflow through the symposer. The valve is typically controlled in accordance with engine RPM. In this manner the amplitude of sound produced by the symposer can be controlled at least somewhat in accordance with the changing engine RPM during acceleration. However, since the length of the flow duct associated with such a prior developed symposer does not change, and nor does the internal volume within the duct change, such systems are typically limited to operating within a relatively narrow frequency range. Moreover, such "static" duct constructions are not amenable to being tuned to emphasize or highlight engine sounds at specific, desired frequencies. As a result, the amplification achieved may not necessarily be achieved over a wide frequency spectrum or a desired frequency spectrum. Put differently, such prior developed systems may only be able to provide a desired level of amplification of the engine sounds emitted while the engine is operating within a narrow frequency band. And since the frequency of the emitted sound can change from a lower frequency to a significantly higher frequency as engine RPM increases, this means that a good portion of the frequency spectrum associated with the sounds made by an accelerating engine may not be detected and amplified sufficiently.

SUMMARY

In one aspect the present disclosure relates to a sound enhancing system, adapted for use with an internal combustion engine of a vehicle, which amplifies engine sounds produced by the engine over a predetermined engine RPM operating range. The sound enhancing system may include a sound enhancing component and a tubular inlet duct. The sound enhancing component may be coupled to structure of the vehicle such that the sound enhancing component is fixed against movement, relative to the engine. The sound enhancing component may be configured to receive air pulsations through the tubular inlet duct, which are being ingested by an induction system of the engine, and where the tubular inlet duct is in communication with a component of the vehicle's induction system. The tubular inlet duct is configured to lengthen and shorten in response to a roll of the engine as the RPM or load of the engine changes. An outlet duct is coupled to an outlet port of the sound enhancing component for channeling sound from the sound enhancing component into or adjacent to a passenger compartment of the vehicle. The change in length of the tubular inlet duct enables a frequency response of the sound enhancing component to be controlled in accordance with the RPM or the load experienced by the engine.

In another embodiment the present disclosure relates to a sound enhancing system adapted for use with an internal combustion engine of a vehicle to amplify engine sounds produced by the engine over a predetermined engine RPM operating range. The sound enhancing system may include a symposer component and a tubular inlet duct. The symposer component may be coupled to structure of the vehicle such that the symposer component is fixed against movement, relative to the engine. The symposer component is configured to receive air pulsations, from air that is being ingested by an induction system of the engine, through the tubular inlet duct. The tubular inlet duct is in communication with a component of the vehicle's induction system and is configured to lengthen and shorten in response to a roll of the engine as the RPM or load experienced by the engine changes. The tubular inlet duct is also in communication with an inlet port of the symposer component and extends generally perpendicular to a major longitudinal length of the vehicle. The tubular inlet port is configured to change in overall length by at least about 30 mm in response to the roll of the engine. The change in length of the tubular inlet duct, in connection with the symposer component, enables tuning of a frequency response of the symposer component in accordance with changing engine RPM or the load experienced by the engine.

In still another aspect the present disclosure relates to a method for enhancing a sound of an internal combustion engine of a vehicle, where the sound is produced over a predetermined engine RPM operating range. The method includes affixing a sound enhancing component to structure of the vehicle such that the sound enhancing component is fixed against movement, relative to the engine. A tubular inlet duct is in communication with the sound enhancing component and with a component of an induction system of the engine. The tubular inlet duct is configured to lengthen and shorten in response to a roll of an engine as the RPM or load of the engine changes, and directs ingested air pulsations of the engine into the sound enhancing component. An outlet duct may be used which is in communication with an outlet port of the sound enhancing component. The outlet duct may be used for channeling sound amplified by the sound enhancing component into, or adjacent to, a passenger compartment of the vehicle. A change in length of the tubular inlet duct, which occurs in response to changes in engine RPM or the load experienced by the engine, may be used to help control a frequency response of the sound enhancing component.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
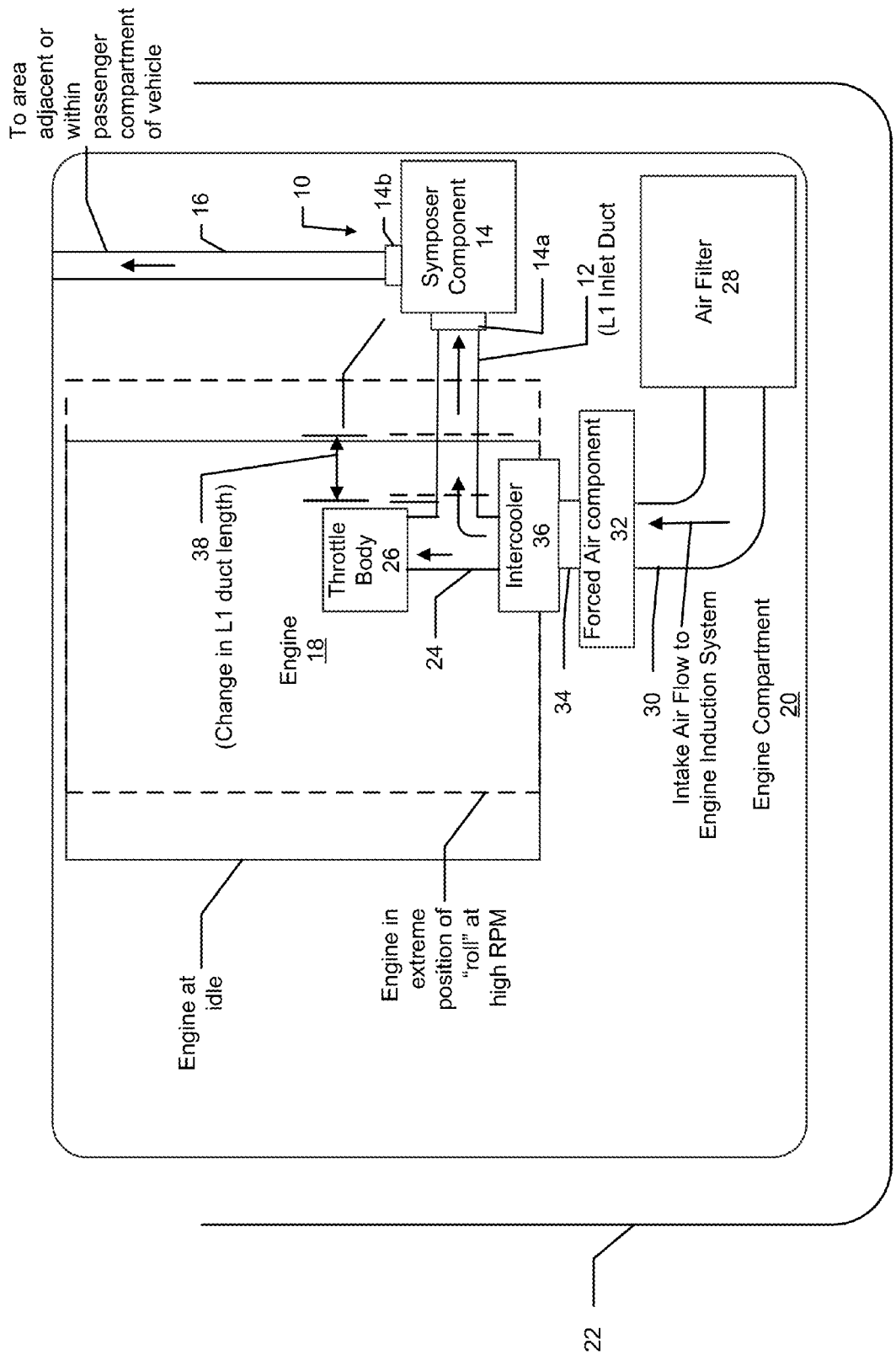
FIG. 1 is a high level diagram illustrating an engine compartment of a motor vehicle and a symposer system in accordance with one embodiment of the sound amplifying system of the present disclosure mounted therein, and further illustrating how the length of a tubular intake duct of the symposer system is able to change in accordance with the "roll" of the vehicle engine during acceleration and deceleration, to thus enable a frequency response of the symposer to be better tuned in accordance with changing engine RPM.

The following description is merely exemplary in nature and is not intended to limit the present disclosure, application, or uses. It should be understood that throughout the drawings, corresponding reference numerals indicate like or corresponding parts and features.

Referring to FIG. 1 there is shown a sound amplification system 10 in accordance with one embodiment of the present disclosure. The sound amplification system 10 in this example is formed by a symposer system, and simply for discussion purposes will be referred to throughout the following specification as "symposer system 10". The symposer system 10 will be described in connection with an engine having a forced air induction system, for example a turbocharged or supercharged engine. It will be appreciated, however, that the teachings described herein are equally applicable to naturally aspirated engines which typically use sound pipes. As such, the embodiments of the symposer system 10 described herein are not limited to any one particular type of engine. And while it is expected that the symposer system 10 will find particular utility in connection with automotive engines, the system 10 is not limited to use with only automotive engines.

The symposer system 10 may include a tubular inlet duct 12 ("L1"), a sound enhancing component in the form of a symposer component 14, and an outlet duct 16. The tubular inlet duct 12 has a longitudinal length which can be increased or decreased in accordance with a "roll" of an engine 18. In this example the engine 18 is mounted longitudinally within an engine compartment 20 of a vehicle 22 such that the engine's crankshaft would be parallel to the major longitudinal dimension of the vehicle. The tubular inlet duct 12 is in flow communication with a component of the vehicle's induction system, in this example an intake air duct 24, which is associated with the inlet of a throttle body 26 of the vehicle's induction system. The tubular inlet duct 12 is also in flow communication with an air inlet port 14a of the symposer component 14. An outlet port 14b of the symposer component 14 is in communication with the outlet duct 16.

Intake air in this example implementation of the system 10 may be delivered from an air filter 28, through a first section of conduit 30, through a forced air compressing component 32, for example a turbocharger or supercharger, then through a second length of conduit 34 to an intercooler 36, and finally to the throttle body 26 via the intake air duct 24. Components 24-36 may be viewed as forming the vehicle's induction system. The symposer component 14 is mounted fixedly to structure apart from the engine 18, for example from a wall of the engine compartment 20 or any other structure associated with the vehicle's chassis. In this manner the symposer component 14 is fixed against movement, relative to the engine 18, as the engine 18 RPM increases or decreases during operation.

As will be appreciated, the intake airflow drawn into the throttle body 26 through the intake air duct 24 will vary according to the throttle position of the vehicle 22, and more particularly in accordance with engine RPM. A characteristic of the engine 18 is that it "rolls" somewhat within the engine compartment 20 as engine load increases. By "roll" it is meant that the engine 18 translates in somewhat of a rolling motion to one side of the engine compartment 20, perpendicular to its crankshaft, as engine RPM increases, and then rolls back to its initial position as the engine returns to its idle RPM. This is typically due in large part to the resistance of the wheels or other drive line components of the vehicle 22 that resist the torque output that the engine 18 is generating as the engine goes from its idle RPM to its maximum operating RPM. The degree of rolling motion may vary based on several factors including the size and torque output of the engine 18, the construction, specific locations and stiffness of the engine mounts that support the engine on a chassis of the vehicle 22, and other variables. Typically, however, the roll experienced by an engine corresponds to translating linear motion (i.e., a linear distance) of typically between about 30 mm-50 mm when the engine RPM increases from idle to the engine's maximum RPM.

Figure 2:
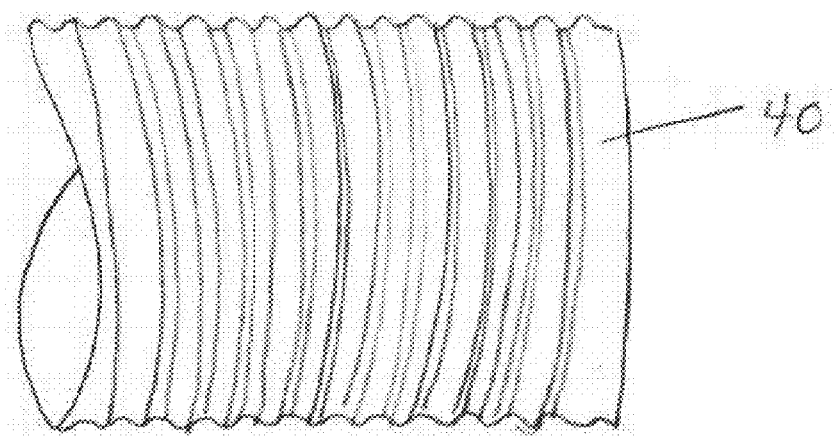
FIG. 2 is a side view of a corrugated conduit that may be used to form the tubular inlet duct of the sound amplifying system of FIG. 1.

An important feature of the symposer system 10 is that the longitudinal length of the tubular inlet duct 12 is able to vary as the engine 18 rolls from its position at idle to its position at wide open throttle. This dimension is indicated by arrow 38 in FIG. 1. Thus, the longitudinal length L1 of the tubular inlet duct 12, and therefore its volume, is able to vary in relation to the engine RPM. To achieve the ability to lengthen and shorten in accordance with changing engine RPM or load, the tubular inlet duct 12 may be constructed from a suitable corrugated conduit, such as conduit 40 shown in FIG. 2. The corrugated conduit 40 may have a built-in reinforcing element, for example a helical metal wire (not shown). The corrugated conduit 40 may also vary in diameter to meet the needs of specific applications, and will likely be selected in part on the size of the engine, the amount of engine roll that is expected to be experienced, and amount of frequency change desired from the symposer system 10. Preferably the corrugated conduit 40 is made from rubber or another suitable material that is resistant to temperature and pressure variations that will be experienced during operation of the engine 18, while still allowing the required change in its length as engine roll occurs.

Figure 3:
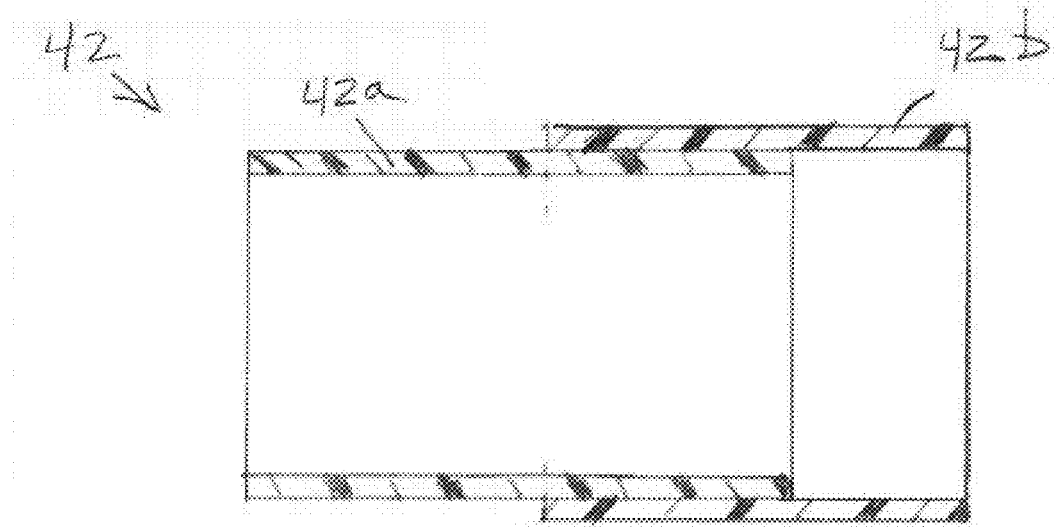
FIG. 3 is a side cross-sectional view of a telescoping duct structure that may be used to form the tubular inlet duct of the sound amplifying system of FIG. 1.

FIG. 3 illustrates another construction for the tubular inlet duct 12 that is formed by a telescoping duct structure 42. In this example the telescoping duct structure 42 incorporates two solid (i.e., non-flexible) duct elements 42a and 42b in telescoping arrangement with one another. In this example the duct element 42a may be coupled to a port associated with the intake air conduit 24, while the duct element 42b would be coupled to the inlet port 14a of the symposer component 14. The two duct elements 42a and 42b are able to slide relative to each other so that the overall linear length of the telescoping duct structure 42, and therefore its internal volume, changes in accordance with the roll experienced by the engine 18. In this example the duct elements 42a and 42 may each be made from a suitable plastic material that is able to withstand the temperature and pressure variations that will be experienced during engine operation.

The overall length of the tubular inlet duct 12, whether in the form of corrugated conduit 40 or telescoping duct structure 42, may vary significantly depending on the specific engine/vehicle application with which it is being used. In one example, however, the tubular inlet duct 12 may be between about 50 mm-150 mm in length. The tubular inlet duct 12 is also preferably constructed to allow for an overall change in length of at least about 30 mm-50 mm. In one example the diameter of the tubular inlet duct 12 may be between about 20 mm-40 mm, and more preferably between about 30 mm-32 mm. However, all of the above dimensions may vary significantly to meet the requirements of a specific engine and/or specific vehicle implementation.

The controlled lengthening and shortening of the tubular inlet duct 12 enables its effective length to be varied, which enables the frequency response of the symposer component 14 to be modified. Thus, the frequency response of the symposer system 10 is able to be "tuned" in accordance with engine RPM and load. This provides a significant advantage over prior developed symposers. Prior developed symposers have typically required the use of an internal valve to modulate the air flow through the symposer, in an effort to control the amplitude of the sound emitted from the symposer. Also, prior developed symposer designs have typically only been able to control the amplitude within a relatively small, fixed frequency band of engine intake sounds. However, a typical internal combustion engine used in a motor vehicle produces engine sounds that vary over a fairly wide frequency spectrum, with the frequency of the sounds typically varying significantly as the engine approaches its maximum operating RPM. The ability of the tubular inlet duct 12 to lengthen and shorten in accordance with changing engine RPM and load allows the symposer to be responsive over a significantly wider frequency spectrum than what is possible with conventional, fixed length inlet tube symposer designs.

Figure 4:
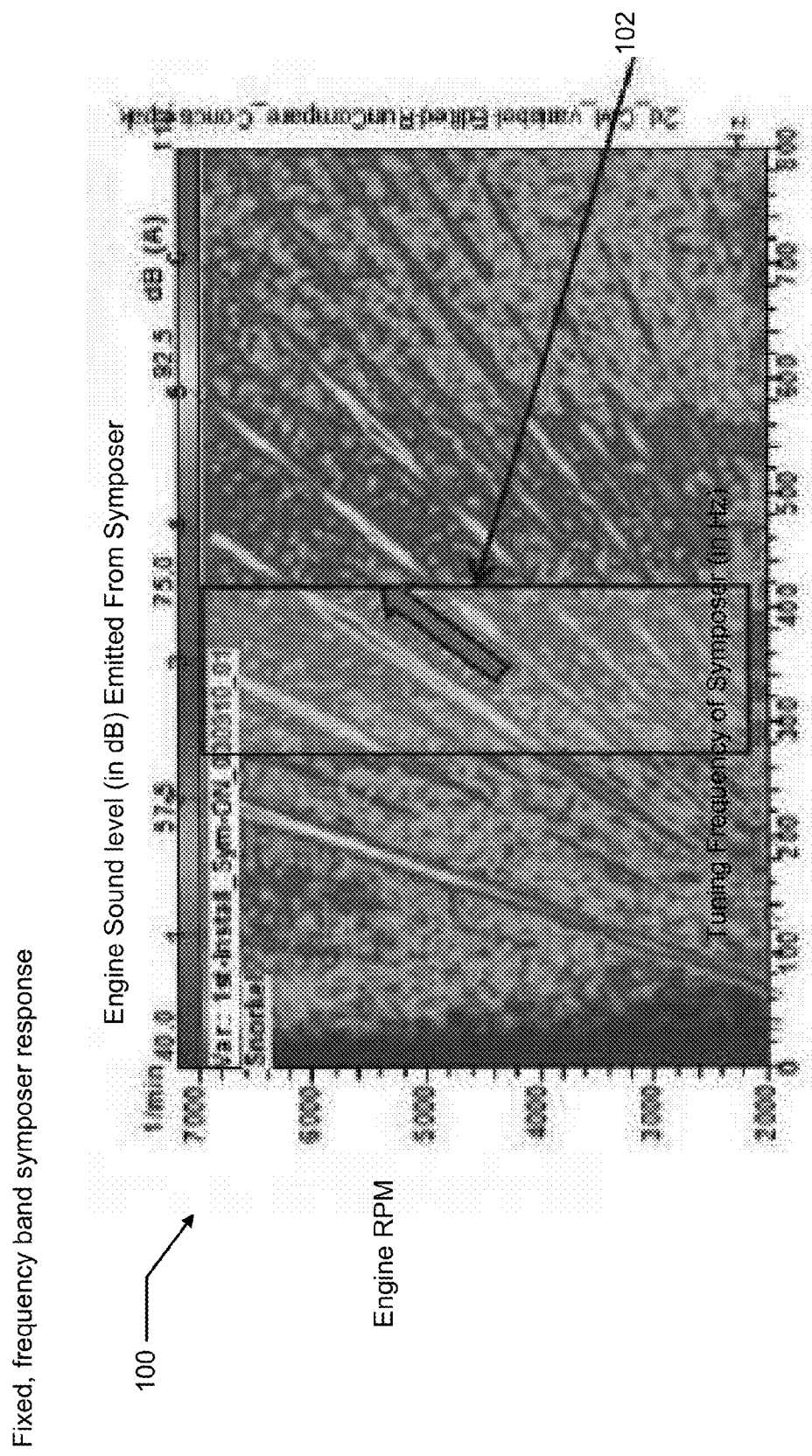
FIG. 4 is a graph illustrating one example of performance of a prior developed symposer system which provides a relatively narrow, fixed frequency band response to changes in engine RPM.

FIG. 4 shows a graph 100 that illustrates a relatively narrow, fixed frequency range, denoted by rectangular line 102, within which a prior developed symposer may operate. It will be appreciated that the sound generated by the engine 18 is comprised of a variety of factors including the sound of air flowing through the intake air duct 24, the sounds of pistons and valves moving within the engine, the sound of the vehicle's cooling fan, and other factors. But most or all of these factors are related to the RPM of the engine and cause sounds that change generally in accordance with changes in the engine RPM. Vehicle manufacturers refer to "orders" when describing the sounds or events that change corresponding to engine speed. FIG. 4 illustrates 6 such orders, with the numbers "1", "2", "3", "4", "5" and "6" across the top edge of the graph 100 indicating the $1^{st}$, $2^{nd}$, $3^{rd}$, $4^{th}$, $5^{th}$ and $6^{th}$ orders. The frequency band indicated by rectangle 102 indicates a frequency range of between about 275 Hz-425 Hz and is fixed. As such, this tuning would be focused primarily on the $4^{th}$ order of engine sounds, and to a much lesser degree to $3^{rd}$ and $5^{th}$ order engine sounds. Moreover, significant portions of the $4^{th}$ order are outside the frequency band within which the symposer operates. In this example the engine RPM ranges from about 2000-3800 RPM and from about 6000-7000 RPM fall outside the frequency band "window" within which the symposer is responsive. As a result, a conventional symposer operating in accordance with the graph 100 would have a significant effect on the $4^{th}$ order engine sounds, a small effect on $3^{rd}$ and $5^{th}$ order engine sounds, and even less effect (or virtually no effect) on the first, $2^{nd}$ and $6^{th}$ order engine sounds.

Figure 5:
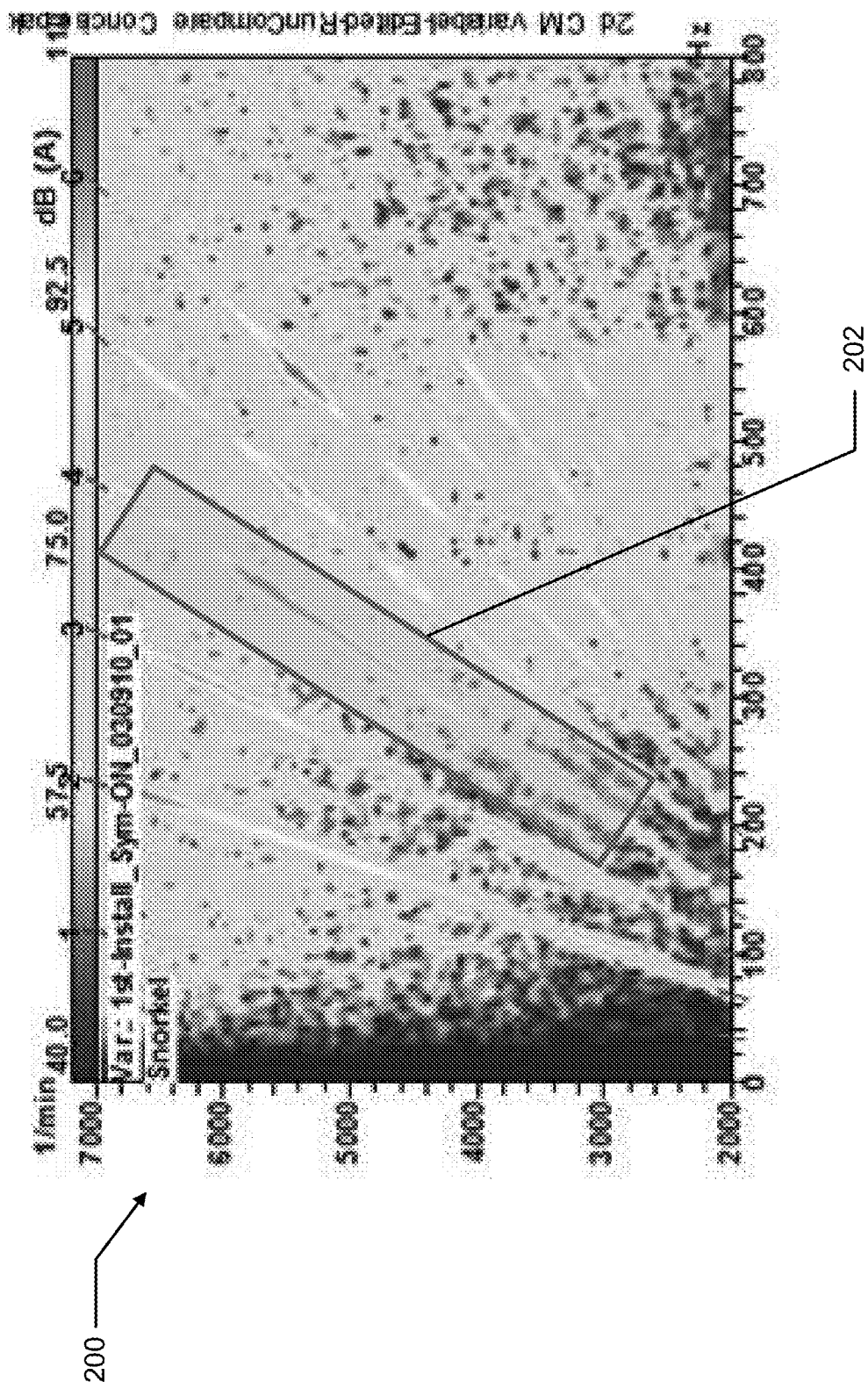
FIG. 5 is a graph illustrating one example of performance of the system of FIG. 1, and specifically how the frequency response of the system of FIG. 1 extends more completely over a desired engine order.

FIG. 5 illustrates a graph 200 in accordance with an example of performance of the symposer system 10 of the present disclosure. It can be seen from graph 200 that the symposer system 10 is responsive over a significantly wider frequency band, in this example between about 200 Hz to about 475 Hz, which is focused around the $4^{th}$ order engine sound. However the system 10 is responsive to the $4^{th}$ order engine sounds over substantially the entire frequency range that the $4^{th}$ order sounds will have. Note also that the $4^{th}$ order engine sounds between about 2500 RPM to about 6800 RPM will fall within the enhancement frequency band of the symposer system 10. By calibrating the tubular inlet duct 12 to control its stiffness and its maximum change in length, the frequency response of the symposer system 10 can be closely tailored to one or more engine orders as may be desired by the vehicle manufacturer. This also enables the symposer system 10 to be employed in connection with a wide range of engines of differing displacements (i.e., horsepower and torque outputs).

The tubular inlet duct 12 of the symposer system 10 is equally well suited to use with normally aspirated engines that would typically employ some form of conventional sound-pipe. By including the tubular inlet duct 12 with such otherwise conventional sound pipes, significantly improved frequency response may be achieved with respect to the specific engine order(s) that the vehicle manufacturer wishes to audibly enhance.

It is also a significant advantage that the symposer system 10 of the present disclosure does not require an internal valve and a control system for controlling the valve. Accordingly, it is expected that the increased cost effectiveness of the symposer system 10 may enable it to be used in vehicle applications where cost would otherwise be a limiting factor if a conventional symposer had to be used.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A sound enhancing system adapted for use with an engine of a vehicle to audibly amplify engine sounds produced by the engine over a predetermined engine RPM operating range, the sound enhancing system including:
  a sound enhancing component coupled to structure of the vehicle such that the sound enhancing component is fixed against movement, relative to the engine, the sound enhancing component configured to receive a flow of a portion of air, in a form of air pulsations, which are being ingested by an induction system of the engine;
  a tubular inlet duct configured to lengthen and shorten in response to a roll of the engine as the RPM of the engine, or a load experienced by the engine, changes, the tubular inlet duct being in communication with an inlet port of the sound enhancing component and with a component of the vehicle's induction system, and thus being responsive to the roll of the engine;
  an outlet duct coupled to an outlet port of the sound enhancing component for channeling sound from the sound enhancing component into or adjacent to a passenger compartment of the vehicle; and
  wherein the change in length of the tubular inlet duct resulting from roll of the engine, which is in response to a change in engine RPM or load experienced by the engine, enables a frequency response of the sound enhancing component to be controlled in accordance with the RPM of the engine.

2. The system of claim 1, wherein the sound enhancing component comprises a symposer component.

3. The system of claim 1, wherein the tubular inlet duct comprises a length of corrugated conduit that changes in overall length, and thus volume, in response to changes in engine RPM or the load experienced by the engine.

4. The system of claim 1, wherein the tubular inlet duct comprises a telescoping duct structure having one element that slides relative to another element, and thus changes in overall length, and thus volume, in response to changes in engine RPM or the load experienced by the engine.

5. The system of claim 1, wherein an overall length of the tubular inlet duct is between about 50 mm-150 mm.

6. The system of claim 1, wherein an overall length of the tubular inlet duct varies by about 30 mm-50 mm in accordance with changes in at least one of engine RPM or the load experienced by the engine.

7. The system of claim 1, wherein the tubular inlet duct comprises a diameter of between about 20 mm to about 40 mm.

8. The system of claim 7, wherein the diameter is between about 30 mm-32 mm.

9. The system of claim 3, wherein the tubular inlet duct is comprised of rubber with a built in reinforcing element.

10. The system of claim 4, wherein the tubular inlet duct is comprised of plastic.

11. A sound enhancing system adapted for use with an engine of a vehicle to audibly amplify engine sounds produced by the engine over a predetermined engine RPM operating range, the sound enhancing system including:
  a symposer component coupled to structure of the vehicle such that the symposer component is fixed against movement, relative to the engine, the symposer component configured to receive a flow of a portion of air in a form of air pulsations, which are ingested by an induction system of the engine;
  a tubular inlet duct configured to lengthen and shorten in response to a roll of the engine as the RPM of the engine, or a load experienced by the engine, changes, the tubular inlet duct being in communication with an inlet port of the symposer component and with a component of the induction system of the vehicle, the tubular inlet duct extending generally perpendicular to a major longitudinal length of the vehicle and also being configured to change in overall length by at least about 30 mm in response to the roll of the engine or the load experienced by the engine; and
  wherein the change in length of the tubular inlet duct, in connection with the symposer component, enables tuning of a frequency response of the symposer component in accordance with changing engine RPM or a change in the load experienced by the engine.

12. The system of claim 11, further comprising an outlet duct coupled to an outlet port of the symposer component for channeling sound from the symposer component into, or adjacent to, a passenger compartment of the vehicle.

13. The system of claim 11, wherein the symposer component comprises a corrugated conduit.

14. The system of claim 11, wherein the symposer component comprises a telescoping structure having first and second elements that move relative to each other.

15. The system of claim 11, wherein the tubular inlet duct comprises an overall diameter of between 20 mm-40 mm.

16. The system of claim 11, wherein the change in length of the tubular inlet duct is between 30 mm to 50 mm.

17. A method for enhancing a sound of an internal combustion engine of a vehicle, where the sound is produced over a predetermined engine RPM operating range, the method including:
  affixing a sound enhancing component to structure of the vehicle such that the sound enhancing component is fixed against movement, relative to the engine;
  using a tubular inlet duct in communication with a component of an induction system of the engine, and configured to lengthen and shorten in response to a roll of an engine as the RPM of the engine changes, to receive and direct air pulsations ingested by the induction system of the vehicle into the sound enhancing component;
  using an outlet duct in communication with an outlet port of the sound enhancing component for channeling sound amplified by the sound enhancing component into, or adjacent to, a passenger compartment of the vehicle; and
  using a change in length of the tubular inlet duct, which occurs in response to the roll of the engine as a result of changes in engine RPM or a load experienced by the engine, to help control a frequency response of the sound enhancing component.

18. The method of claim 17, wherein using a tubular inlet duct comprises using a corrugated conduit.

19. The method of claim 17, wherein using a tubular inlet duct comprises using a telescoping duct structure.

20. The method of claim 17, wherein the length of the tubular inlet duct is able to change by at least about 30 mm in response to a change in RPM or the load experienced by the engine.

\* \* \* \* \*